United States Patent [19]

Hunt et al.

[11] Patent Number: 5,451,548
[45] Date of Patent: Sep. 19, 1995

[54] ELECTRON BEAM DEPOSITION OF GALLIUM OXIDE THIN FILMS USING A SINGLE HIGH PURITY CRYSTAL SOURCE

[75] Inventors: Neil E. J. Hunt, Scotch Plains; Matthias Passlack, New Providence; Erdmann F. Schubert, New Providence; George J. Zydzik, Columbia, all of N.J.

[73] Assignee: AT&T Corp., Murray Hill, N.J.

[21] Appl. No.: 217,296

[22] Filed: Mar. 23, 1994

[51] Int. Cl.[6] .................. H01L 21/00; H01L 21/02; H01L 21/302; H01L 21/463

[52] U.S. Cl. .................. 437/225; 437/228

[58] Field of Search .................. 437/225, 228

[56] References Cited

U.S. PATENT DOCUMENTS 4,617,192 10/1986 Chin et al. .................. 427/42
4,749,255 7/1988 Chakrabarti et al. .................. 350/164

OTHER PUBLICATIONS

M. Fleischer, et al., "Stability of Semiconducting Gallium Oxide Thin Films", Thin Solid Layers, 190 (1990) 93–102.

A. Callegari, et al., "Unpinned Gallium Oxide/GaAs Interface by Hydrogen and Nitrogen Surface Plasma Treatment", Appl Phys Lett, 454(4) 23 Jan. 1989, pp. 332–334.

Primary Examiner—R. Bruce Breneman
Assistant Examiner—Byron S. Everhart
Attorney, Agent, or Firm—Oleg E. Alber

[57] ABSTRACT

Disclosed is a method of fabricating a stoichiometric gallium oxide ($Ga_2O_3$) thin film with dielectric properties on at least a portion of a semiconducting, insulating or metallic substrate. The method comprises electron-beam evaporation of single crystal, high purity $Gd_3Ga_5O_{12}$ complex compound combining relatively ionic oxide, such as $Gd_2O_3$, with the more covalent oxide $Ga_2O_3$ such as to deposit a uniform, homogeneous, dense $Ga_2O_3$ thin film with dielectric properties on a variety of said substrates, the semiconducting substrates including III-V and II-VI compound semiconductors.

17 Claims, 4 Drawing Sheets

ELECTRON BEAM DEPOSITION OF GALLIUM OXIDE THIN FILMS USING A SINGLE HIGH PURITY CRYSTAL SOURCE

TECHNICAL FIELD

This invention concerns gallium oxide thin films.

BACKGROUND OF THE INVENTION

Dielectric thin films play an important role in achieving desired performance of electronic and optoelectronic devices. Dense, closely packed thin films are required to protect the surface of semiconductor devices from contamination and oxidation. Dielectric thin films providing particular properties at the dielectric/semiconductor interface, such as low interface state density, are required in metal/insulator/semiconductor structures, and for laser facet or light-emitting device coatings.

In the case of electronic and optoelectronic III-V or II-VI semiconducting devices, a variety of materials has been proposed for such thin surface films including $Al_2O_3$, $SiO_x$, $SiN_x$, $ZrO_2$ and gallium oxide. The $Al_2O_3$, $SiO_x$, $SiN_x$, and $ZrO_2$ thin films were fabricated with dielectric properties and provide an encapsulation layer for surface protection. The midgap interface state density is in the $10^{13}$ cm$^{-2}$ eV$^{-1}$ range when deposited on bare GaAs samples and can be reduced to about $10^{12}$ cm$^{-2}$ eV$^{-1}$ when deposited on GaAs samples previously treated by dry or liquid surface passivation techniques. Gallium oxide thin films with dielectric properties have not been reported yet. Gallium oxide thin films deposited in an oxygen radio frequency plasma in a vacuum system, in conjunction with a GaAs surface previously treated by $H_2$ and $N_2$ plasma, give dielectric/GaAs interfaces with a midgap density of interface states well below $10^{11}$ cm$^{-2}$eV$^{-1}$.

It is therefore an object of the invention to provide stoichiometric gallium oxide thin films with dielectric properties on semiconducting, insulating and metallic substrates, in particular on III-V semiconducting substrates.

SUMMARY OF THE INVENTION

The invention is a method of fabricating a stoichiometric gallium oxide ($Ga_2O_3$) thin film with dielectric properties on at least a portion of a semiconducting, insulating or metallic substrate. The method comprises electron-beam evaporation of a single crystal, high purity $Gd_3Ga_5O_{12}$ complex compound to deposit a uniform, homogeneous, dense $Ga_2O_3$ thin film with dielectric properties on a variety of said substrates, the semiconducting substrates including III-V and II-IV compound semiconductors.

It will be appreciated that, for purpose of illustration, these figures are not necessarily drawn to scale.

DETAILED DESCRIPTION OF THE INVENTION

Figure 1:
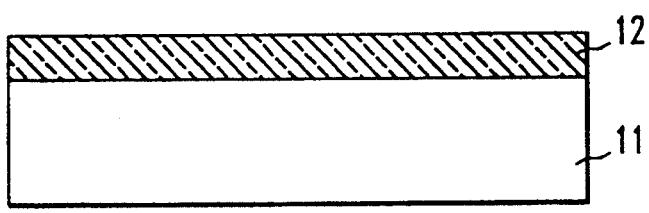
FIG. 1 is a schematic side view of a device in accordance with an aspect of the invention.
Figure 2:
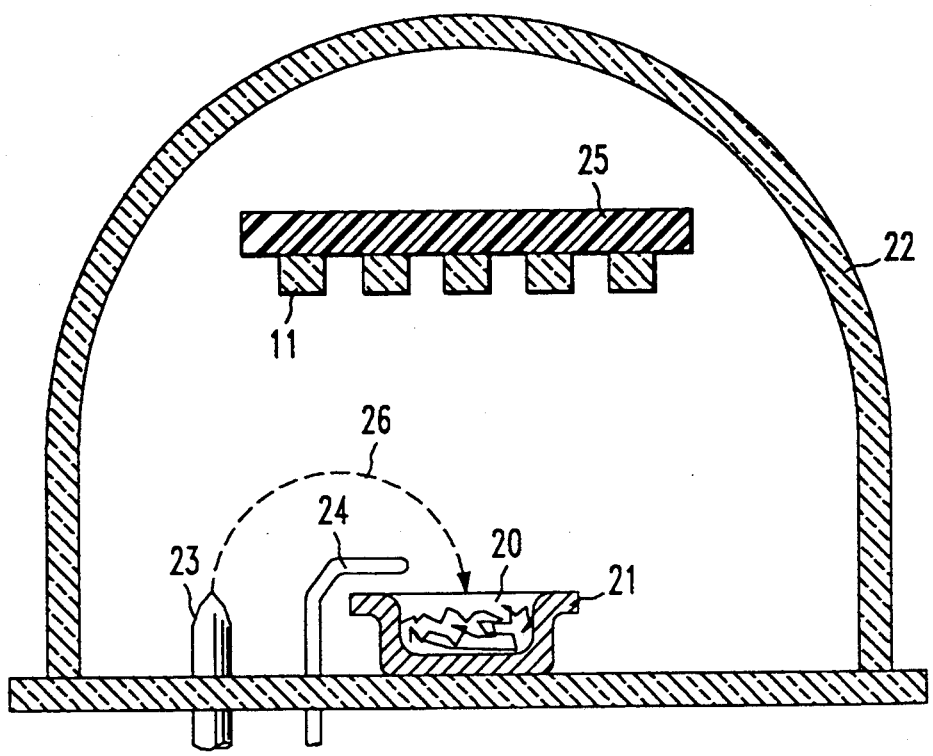
FIG. 2 is a schematic side view of an electron-beam evaporation apparatus utilized to practice the invention in accordance with another aspect of the invention.

In FIG. 1 is disclosed a structure, 10, including a semiconducting, insulating or metallic substrate 11, and a $Ga_2O_3$ thin film, 12, with dielectric properties formed on at least of a portion of the substrate. By way of example only, this $Ga_2O_3$ thin film could be used as an antireflection layer, a surface protection layer, a surface passivation layer, and as an insulator in a metal/insulator/semiconductor structure or in a metal/insulator/metal structure. Uniform, homogeneous, dense $Ga_2O_3$ thin films with dielectric properties were deposited in thicknesses between 40 Å and 4000 Å by electron-beam evaporation utilizing apparatus illustrated in FIG. 2 using a special source material, 20.

The electron-beam evaporation is a well known process and does not need any special detailing. For example see U.S. Pat. No. 4,749,255.

The source material is prepared from a high purity single crystal $Gd_3Ga_5O_{12}$ complex compound which is a chemical combination of relatively ionic oxides such as $Gd_2O_3$ with the more covalent oxide $Ga_2O_3$. The more ionic oxides are those formed by the elements in column IIA including lanthanides of the Periodic Table. The $Gd_3Ga_5O_{12}$ source material is provided within a standard or noble crucible 21, contained in an evacuated evaporation chamber, 22. Also included within the chamber are a source of electrons, such as filament, 23, an oxygen leak valve 24, and at least one semiconducting, insulating, or metallic substrate, 11, located on a holder or support, 25. The substrate may be provided with a mask or patterned by photoresist. The beam of electrons, 26, is directed to the source material 20, to cause heating of said complex compound $Gd_3Ga_5O_{12}$ while vaporizing $Ga_2O_3$ as a target material that slowly evolves by decrepitation of $Gd_3Ga_5O_{12}$. Deposition is kept at a rate of from 0.2 to 4.0 Angstroms per second, preferably from 0.5 to 1.5 Angstroms per second, more preferably 0.5 Å per second. The deposition is kept at such a rate as to maintain temperature of $Gd_3 Ga_5O_{12}$ between 1900K and 2100K. This temperature of the high purity single crystal complex compound $Gd_3Ga_5O_{12}$ causes the target material evolving slowly, thus eliminating splattering and maintaining high purity of deposited target material. Pretransition oxides such as $Gd_2O_3$ have boiling points of over 4000K and do not evaporate at temperatures of about 2000K.

Substrate 11 was held during deposition at substrate temperatures, $T_s$, between 40° C. and 370° C. The background pressure in the evaporation chamber was kept at or above $1 \times 10^{-10}$ Torr. The oxygen partial pressure in the evaporation chamber was further varied between experimental limits of no excess oxygen at $1 \times 10^{-6}$ Torr and, using oxygen leak valve 24, an oxygen partial pressure of $2 \times 10^{-4}$ Torr.

Figure 3:
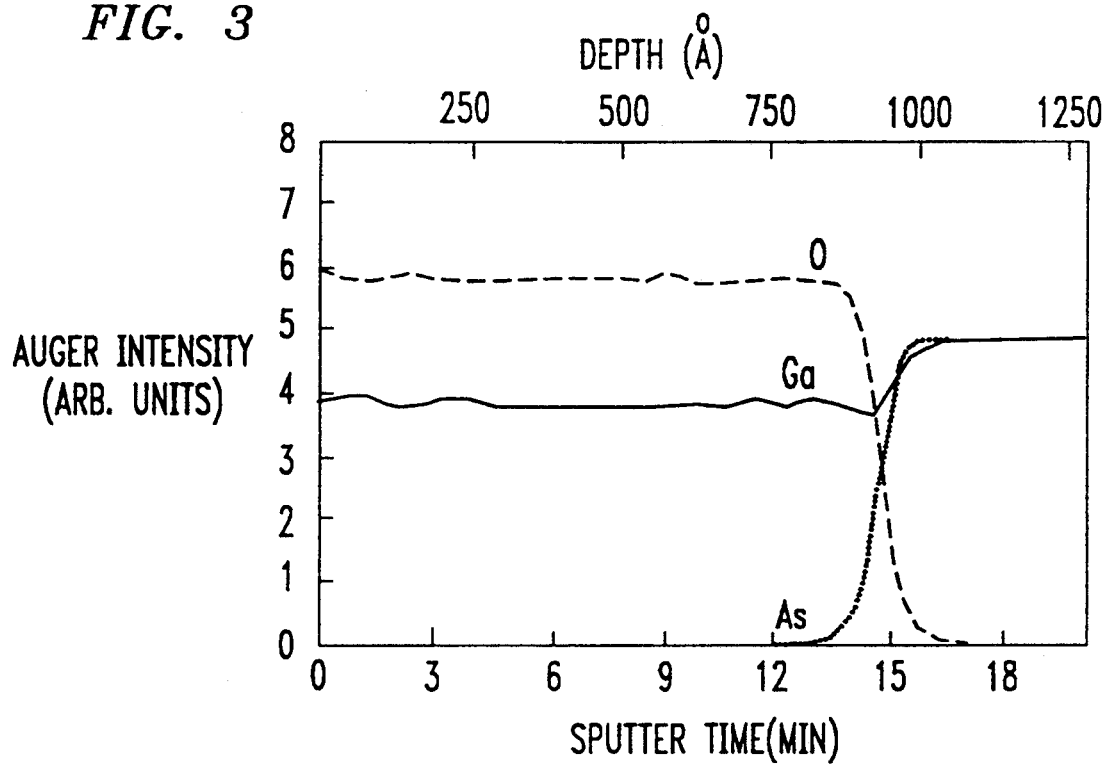
FIG. 3 is a plot of an Auger depth profile of a 955 Å thick $Ga_2O_3$ layer which was deposited on a GaAs substrate maintained during deposition at 125° C. with $O_2$ partial pressure of $2\times10^{-4}$ Torr in the evaporation chamber.

A 955 Å thick $Ga_2O_3$ thin film deposited on a GaAs substrate maintained at $T_s = 125°$ C. during deposition and an $O_2$ partial pressure of $2 \times 10^{-4}$ Torr in the evaporation chamber, was investigated by Auger depth profiling. The analysis was done by using 4 keV Ar ions and the sensitivity factors for Ga and O were calibrated against pressed $Ga_2O_3$ powder. The nominal etch rate was 65 Å per minute. The measurements, as illustrated in FIG. 3, demonstrate that, within the limits of Auger spectroscopy, the films are stoichiometric and homogeneous. Rutherford backscattering (RBS) measurements on films deposited at substrate temperatures ranging between 40° C. and 150° C. during deposition and an $O_2$ partial pressure of $2 \times 10^{-4}$ Torr in the evaporation chamber confirm a perfect stoichiometry of these films with 60% oxygen and 40% gallium. Gadolinium, which is considered to be the main impurity in $Ga_2O_3$ films deposited by said method of fabrication, was investigated by selective ion mass spectroscopy and RBS measurements. The Gd content is about 0.1%.

Figure 4:
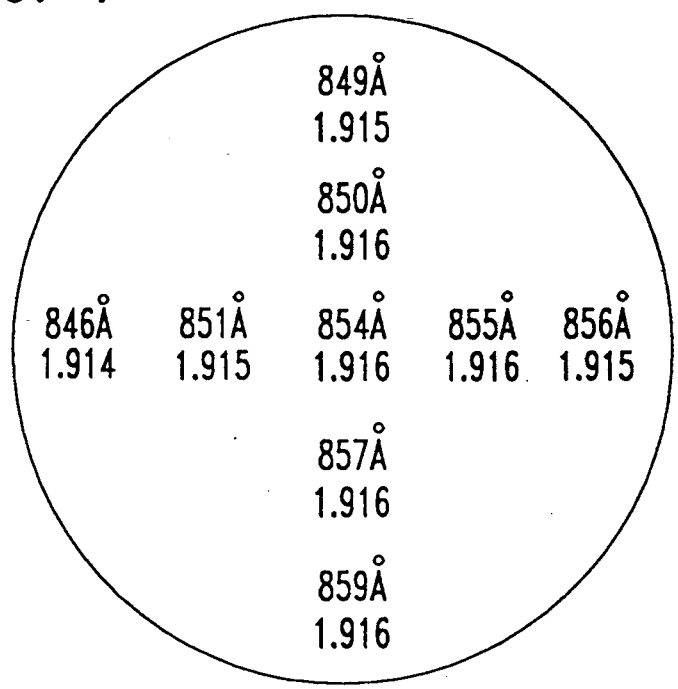
FIG. 4 illustrates distribution of refractive index and thickness of a $Ga_2O_3$ thin film over a 2 inch wafer.

The distribution of refractive index and thickness of a $Ga_2O_3$ thin film produced by the above-described procedure over a 2 inch in diameter wafer was also investigated. The film was deposited on a Si substrate maintained during deposition at 40° C. and with a background pressure of $1-2 \times 10^{-6}$ Torr with no excess oxygen in the evaporation chamber. As illustrated in FIG. 4, the relative standard deviation of the mean value for refractive index and thickness is very small, being 0.04% and 0.5%, respectively. Similar highly uniform characteristics were measured for $Ga_2O_3$ thin films deposited on Si and GaAs substrates maintained at temperatures ranging between 40° C. and 150° C. during deposition and an $O_2$ partial pressure of $2 \times 10^{-4}$ Torr in the evaporation chamber.

The etch rates of as-grown $Ga_2O_3$ thin films deposited at substrate temperatures, $T_s$, between 40° C. and 370° C. during deposition were investigated for the experimental limits of no excess oxygen and oxygen partial pressure of $2 \times 10^{-4}$ Torr in the evaporation chamber. The etch rates in 10% HF measured at a temperature of 300K were found to be between 430 and 1360 Å per minute indicating dense, closely packed films. For comparison, PECVD $SiO_2$ deposited at a substrate temperature of 300K etches at a rate of 2000 Å per minute in 10% HF at 300K.

Metal/insulator/metal (Au/Ti/$Ga_2O_3$/TiW/$n^+$Si substrate) and metal/insulator/semiconductor (Au/Ti/$Ga_2O_3$/$n^+$GaAs) structures were fabricated in order to investigate dielectric properties of as-grown $Ga_2O_3$ thin films deposited by said method of fabrication. Ti/Au dots with different diameters (50, 100, 200, 500 μm) were fabricated on top of $Ga_2O_3$ by evaporation through a shadow mask. Dielectric properties were obtained for $Ga_2O_3$ thin films deposited at substrate temperatures, $T_s$, below 50° C. for the experimental limit of no excess oxygen in the evaporation chamber. Dielectric properties were also obtained for $Ga_2O_3$ thin films deposited at substrate temperatures, $T_s$, below 150° C. for the experimental limit of $2 \times 10^{-4}$ Torr $O_2$ pressure in the evaporation chamber. The degradation of $Ga_2O_3$ film properties such as the dc breakdown field (FIG. 5) and specific resistivity (FIG. 6) at higher substrate temperatures may be attributed to oxygen loss during deposition.

Figure 5:
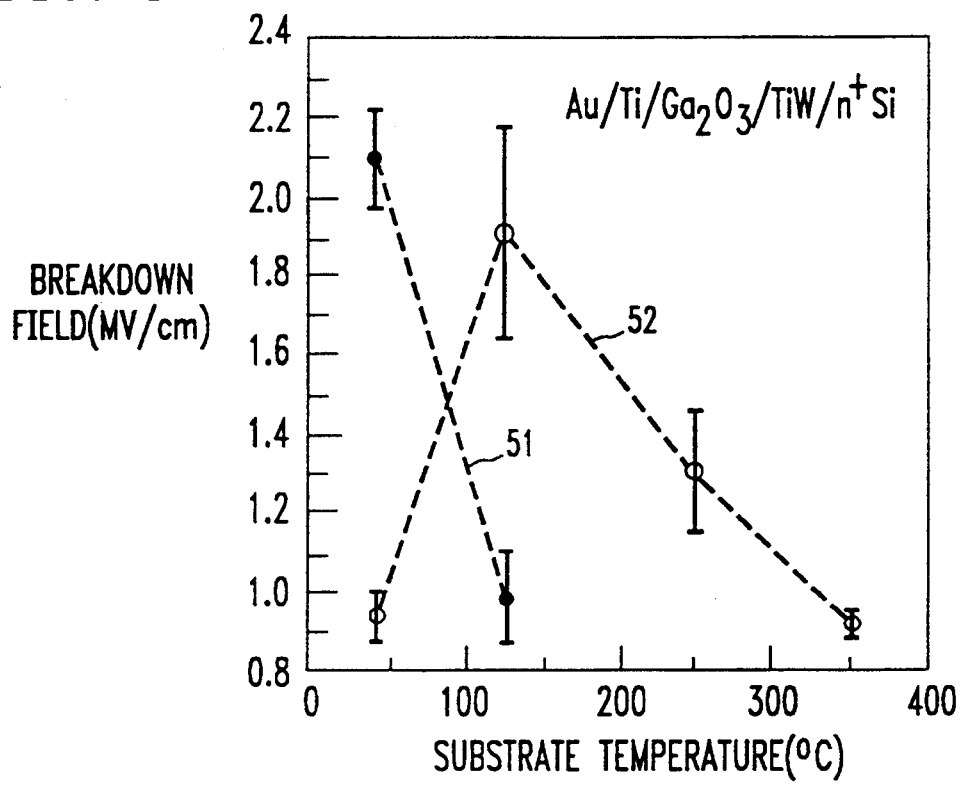
FIG. 5 is a plot of dc breakdown field vs. substrate deposition temperature measured at 300K for $Ga_2O_3$ films deposited with no excess oxygen at a background pressure of $1-2\times10^{-6}$ Torr (Curve 51) and with $2\times10^{-4}$ Torr oxygen present (Curve 52) in the evaporation chamber.

FIG. 5 is a plot of dc breakdown field vs. substrate temperature during deposition measured at 300K for $Ga_2O_3$ films with thicknesses between 500 Å and 4000 Å, deposited with no excess oxygen at a background pressure of $1-2 \times 10^{-6}$ Torr (Curve 51) and with $2 \times 10^{-4}$ Torr oxygen present (Curve 52) in the evaporation chamber. The voltage at which destructive breakdown occurs, normalized to the film thickness, is defined as breakdown field $E_m$. The best results were obtained for samples deposited at substrate temperature $T_s = 40°$ C. and background pressure of $1-2 \times 10^{-6}$ Torr during deposition (no excess oxygen) with $E_m = 2.1 \pm 0.1$ MV/cm. The breakdown voltage scales correctly with the oxide thickness for films thicker than 500 Å. Slightly larger values for $E_m$ were obtained for thinner films.

Figure 6:
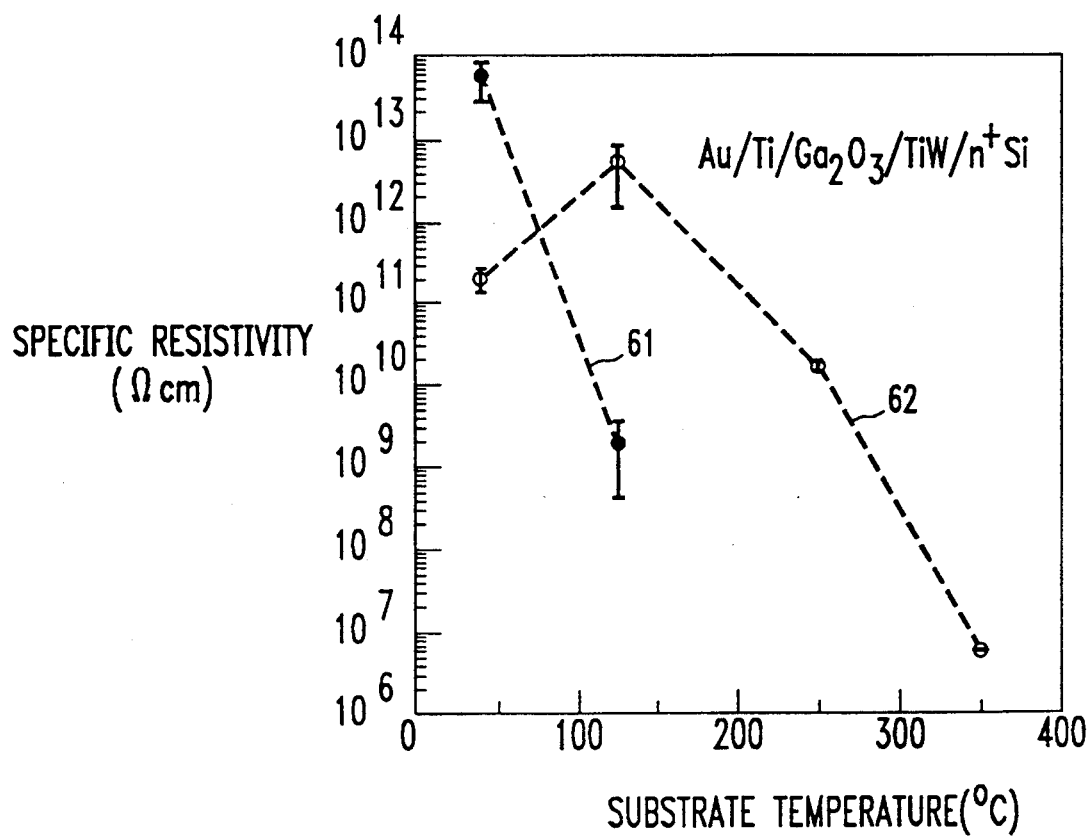
FIG. 6 shows a plot of specific resistivities vs. substrate deposition temperature measured at 300K for $Ga_2O_3$ films deposited at a background pressure of $1-2\times10^{-6}$ Torr with no excess oxygen (Curve 61) and with $2\times10^{-4}$ Torr oxygen present (Curve 62) in the evaporation chamber.

FIG. 6 shows a plot of specific resistivities vs. substrate temperature during deposition measured at 300K for $Ga_2O_3$ films deposited at a background pressure of $1-2 \times 10^{-6}$ Torr with no excess oxygen (Curve 61) and with $2 \times 10^{-4}$ Torr oxygen present (Curve 62) in the evaporation chamber. The specific resistivity, $\rho$, strongly depends on deposition conditions such as substrate temperature and oxygen partial pressure in the evaporation chamber during deposition, and is especially sensitive to substrate temperature for deposition with no excess oxygen. The best results of $\rho = (6.3) \times 10^{13}$ Ω cm were again obtained for samples deposited at a substrate temperature of 40° C. and a background pressure of $1-2 \times 10^{-6}$ Torr with no excess oxygen during deposition. An increase of substrate temperature from 40° C. to 125° C. at background pressure of $1-2 \times 10^{-6}$ Torr with no excess oxygen during deposition, however, leads to a drastically reduced $\rho = (2 \pm 1) \times 10^{9}$ Ω cm.

Figure 7:
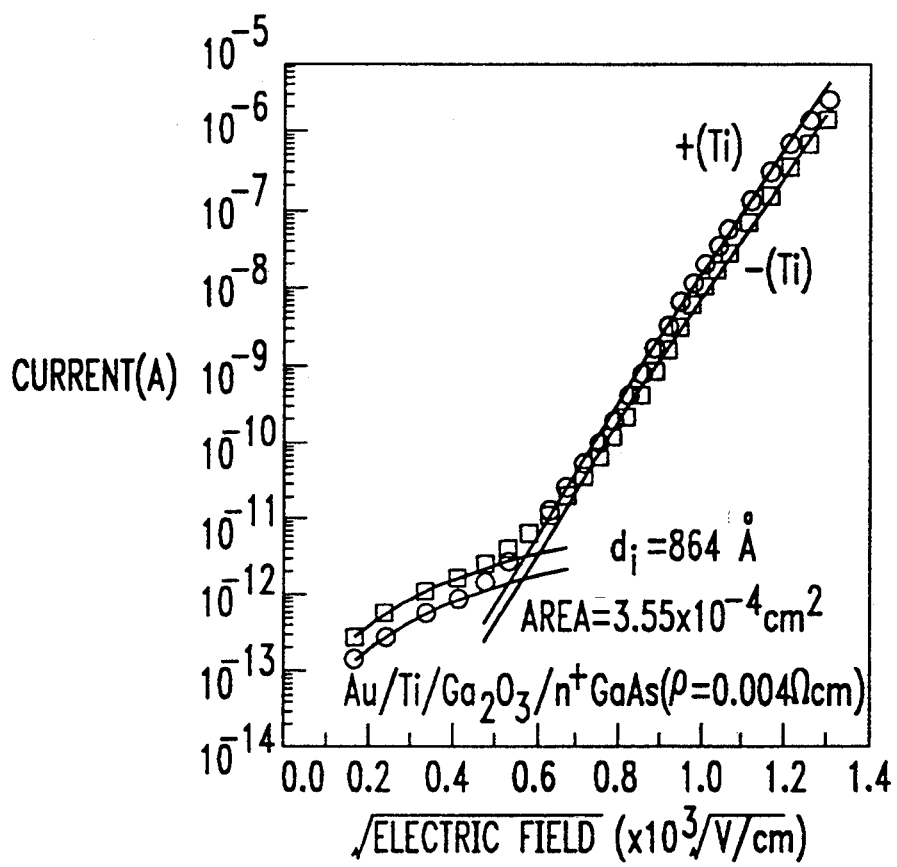
FIG. 7 is a plot of current vs. $\sqrt{\text{electric field}}$ characteristics of a Au/Ti/$Ga_2O_3$/GaAs metal/insulator/semiconductor structure measured at 300K with an 864 Å thick $Ga_2O_3$ film deposited at substrate temperature of 40° C. and a background pressure of $1-2\times10^{-6}$ Torr with no excess oxygen in the evaporation chamber.
Figure 8:
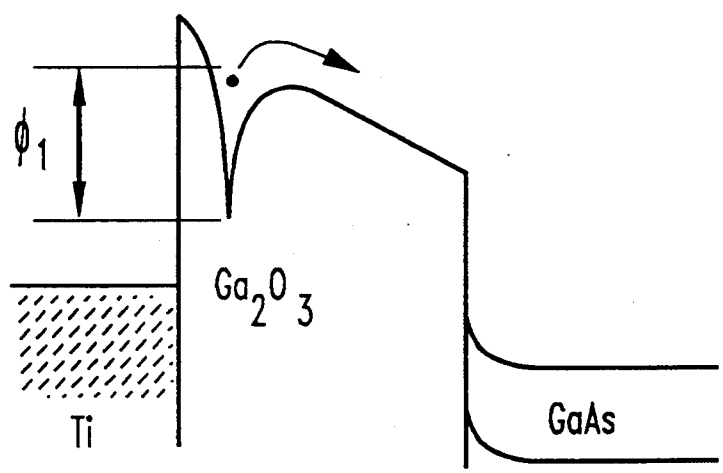
FIG. 8 illustrates a Frenkel-Poole emission from trapped electrons in the $Ga_2O_3$ layer of a metal/insulator/semiconductor structure.

FIG. 7 is a plot of current vs. $\sqrt{\text{electric field}}$ characteristics of a Au/Ti/$Ga_2O_3$/GaAs metal/insulator/semiconductor structure measured at 300K with an 864 Å thick $Ga_2O_3$ film deposited at substrate temperature of 40° C. and a background pressure of $1-2 \times 10^{-6}$ Torr with no excess oxygen in the evaporation chamber. Two distinct regions of current transport, which is nearly independent of polarity of the electrodes, can be clearly identified. The Ohmic I-V characteristic at low fields is due to hopping of thermally excited electrons from one isolated state in the oxide to another. As illustrated in FIG. 8, the current at high fields is dominated by field enhanced thermal excitation of trapped electrons into the conduction band (internal Schottky emission or Frenkel-Poole effect)

$$j \propto E \exp\{-q\{\{\phi_1 - [qE/\pi\epsilon_o\epsilon_d]^{0.5}\}/kT)\}\}$$

where E is the electric field, q is the electronic charge, $\phi_1$ is the barrier height, $\epsilon_o$ is the vacuum dielectric constant, $\epsilon_d$ is the dynamic dielectric constant, T is temperature in K, and k is the Boltzmann constant. The Frenkel- Poole emission is a bulk effect in the insulating layer with a dynamic dielectric constant $\epsilon_d$ between $\epsilon_\infty = 3.61$ and $\epsilon_s = 9.93$. From the high field characteristics in FIG. 7, a dynamic dielectric constant $\epsilon_d$ of 4 was found. This is in agreement with the assumption of Frenkel-Poole emission as the dominant transport mechanism. On the other hand, assuming Schottky emission across the metal/insulator or insulator/semiconductor interface as the dominant transport mechanism would lead to an anomalous dynamic dielectric constant $\epsilon_d < 1$. Thus, like in other dielectrics, the current transport mechanisms at both low and high electric fields were found to be bulk rather than electrode controlled.

Capacitance measurements with no bias applied to the structure were done on said metal/insulator/metal (n+Si substrate/TiW/Ga$_2$O$_3$/Ti/Au) structures with Ga$_2$O$_3$ films deposited at substrate temperature of 40° C. and background pressure of $1-2\times10^{-6}$ Torr with no excess oxygen in the evaporation chamber during deposition, and with Ga$_2$O$_3$ films deposited at substrate temperature of 125° C. and an oxygen partial pressure of $2\times10^{-4}$ Torr in the evaporation chamber during deposition. The capacitance is found to be independent on frequency within the measurement range between 100 Hz and 1 MHz, and scales correctly with oxide thickness. The static dielectric constant $\epsilon_s$ was determined to be $9.9\pm0.4$ and $10.2\pm0.6$, respectively. These results are in close agreement with $\epsilon_s = 10.2\pm0.3$ for single crystal Ga$_2$O$_3$ platelets.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A process for fabricating a structure comprising a substrate and a thin film of gallium oxide, which comprises depositing a target material on at least a part of a surface of a substrate by a particle beam deposition procedure so that said surface is at least partially covered with a contacting material region, said substrate being selected from the group consisting of semiconductor, insulating and metal substrates, in which
said material region comprises a thin film of Ga$_2$O$_3$ deposited by electron-beam evaporation using a high purity single crystal Gd$_3$Ga$_5$O$_{12}$ source, at substrate temperatures ranging from 40° C. to 370° C. and background pressures at or above $1\times10^{-10}$ Torr.

2. A process of claim 1, in which said Ga$_2$O$_3$ thin film is deposited with dielectric characteristics on said surface at temperatures below 50° C. and a background pressure of $1\times10^{-6}$ Torr without introduction of any additional O$_2$ into the deposition chamber.

3. A process of claim 2, in which said temperature is about 40° C.

4. A process of claim 1, in which said Ga$_2$O$_3$ thin film is deposited with dielectric characteristics on said surface kept at temperatures below 150° C. and with introduction of an additional O$_2$ at partial oxygen pressure $2\times10^{-4}$ Torr.

5. A process of claim 4, in which said temperature is about 125° C.

6. A process of claim 1, in which said thin film is deposited as a part of a structure comprising a semiconductor material, a metal layer, said thin film and another metal layer.

7. A process of claim 1, in which said thin film is deposited as a part of a structure comprising a semiconductor, said thin film and a metal layer.

8. A process of preparing structure comprising a substrate and a dielectric thin film on a surface of a substrate, which comprises
maintaining said substrate in a deposition chamber at a temperature ranging from 40° to 370° C.,
maintaining in the deposition chamber a pressure and
depositing a Ga$_2$O$_3$ thin film on said substrate by electron beam evaporation from a high purity, single crystal Gd$_3$Ga$_5$O$_{12}$ source.

9. A process of claim 8, in which said Ga$_2$O$_3$ thin film is deposited on said surface at temperatures below 50° C. and a pressure of $1\times10^{-6}$ Torr without introduction of any additional O$_2$ into the deposition chamber.

10. A process of claim 9, in which said temperature is about 40° C.

11. A process of claim 8, in which said Ga$_2$O$_3$ thin film is deposited on said surface kept at temperatures below 150° C. and with an introduction of an additional O$_2$ at partial oxygen pressure $2\times10^{-4}$ Torr.

12. A process of claim 11, in which said temperature is about 125° C.

13. A process of claim 8, in which the said substrate is selected from the group consisting of semiconductor, insulating and metal materials.

14. A process of claim 8, in which said substrate is a semiconductor substrate comprising semiconductor material selected from the group consisting of III-V and II-VI compound semiconductors.

15. A process of claim 14, in which said semiconductor comprises GaAs.

16. A process of claim 8, in which substrate is a metal selected from the group consisting of Ti, Pt, Au, Ni, Cr and their alloys.

17. A process of claim 8, in which said substrate is an insulator selected from the group consisting of oxides, nitrides and fluorides.

* * * * *